United States Patent
Kiku et al.

(10) Patent No.: US 7,686,889 B2
(45) Date of Patent: Mar. 30, 2010

(54) SUSCEPTOR FOR SEMICONDUCTOR MANUFACTURING APPARATUS

(75) Inventors: Taiji Kiku, Handa (JP); Yutaka Unno, Handa (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 4 days.

(21) Appl. No.: 12/049,615

(22) Filed: Mar. 17, 2008

(65) Prior Publication Data

US 2008/0236479 A1    Oct. 2, 2008

(30) Foreign Application Priority Data

Mar. 26, 2007   (JP) .............................. 2007-080283

(51) Int. Cl.
*C23C 16/00* (2006.01)
*C23F 1/00* (2006.01)
*H01L 21/306* (2006.01)

(52) U.S. Cl. .................. 118/720; 118/725; 156/345.51; 156/345.52

(58) Field of Classification Search .................. 118/728, 118/729, 730, 731, 732; 156/345, 345.51, 156/345.52, 345.53, 345.54, 345.55; 219/385, 219/443.1, 444.1; 294/64.1
See application file for complete search history.

(56) References Cited

U.S. PATENT DOCUMENTS

| | | | | |
|---|---|---|---|---|
| 4,707,012 A * | 11/1987 | Takagi | ...................... | 294/64.1 |
| 5,688,331 A * | 11/1997 | Aruga et al. | ................. | 118/725 |
| 6,264,467 B1 * | 7/2001 | Lue et al. | ..................... | 432/253 |
| 6,954,269 B2 * | 10/2005 | Gaal et al. | ................... | 356/244 |

FOREIGN PATENT DOCUMENTS

JP    2002-184844 A1    6/2002

* cited by examiner

*Primary Examiner*—Parviz Hassanzadeh
*Assistant Examiner*—Tiffany Nuckols
(74) *Attorney, Agent, or Firm*—Burr & Brown

(57) ABSTRACT

There is provided a susceptor for semiconductor manufacturing apparatus that offers excellent thermal uniformity of a substrate being secured by vacuum chucking. A susceptor for semiconductor manufacturing apparatus includes an aluminum-nitride support member in which heater electrodes are buried to heat the substrate, a recessed wafer pocket formed on an upper surface of the support member, a through hole formed in the wafer pocket, and a seal band that supports the substrate at a periphery of the wafer pocket, and on an upper surface of the seal band, a plurality of gas channels are formed to allow gas in a chamber to pass through the gas channels from an outer circumference of the seal band toward the wafer pocket.

4 Claims, 3 Drawing Sheets

SUSCEPTOR FOR SEMICONDUCTOR MANUFACTURING APPARATUS

CROSS REFERENCE TO RELATED APPLICATION

This application is based upon and claims the benefit of priority from a Japanese Patent Application No. TOKUGAN 2007-80283, filed on Mar. 26, 2007; the entire contents of which are incorporated herein by reference.

BACKGROUND OF THE INVENTION

1. Field of the Invention

The present invention relates to a susceptor for semiconductor manufacturing apparatus that secures a substrate by vacuum chucking.

2. Description of the Related Art

As disclosed in Japanese Patent Laid-Open No. 2002-184844, susceptors for semiconductor manufacturing apparatus have been known which include a support member on which a substrate is placed, a recessed wafer pocket formed on an upper surface of the support member, a seal band that supports the substrate at a periphery of the wafer pocket, and a through hole formed in the wafer pocket, and which secure the substrate onto an upper surface of the seal band by evacuation through the through hole from the upper surface of the support member toward a lower surface of the same. Such a susceptor for semiconductor manufacturing apparatus can prevent a warp or displacement of a substrate when it is machined.

According to the conventional susceptor for semiconductor manufacturing apparatus, however, pressure reduction in a space between the wafer pocket and a rear surface of the substrate hinders heat transfer from the susceptor to the substrate in a wafer pocket area, so that the temperature of a substrate region above the wafer pocket becomes comparatively low. In contrast, the seal band, which is in direct contact with the substrate, transfers a large amount of heat from the susceptor to the substrate, so that the temperature of a substrate region above the seal band becomes comparatively high. Therefore, this conventional susceptor for semiconductor manufacturing apparatus produces a heat-distributed condition in an in-plane direction of the substrate when vacuum chucking is being done, which makes the thermal uniformity of the substrate worse.

The present invention has been made to solve the aforementioned problem, and an object thereof is to provide a susceptor for semiconductor manufacturing apparatus which exhibits excellent thermal uniformity of a substrate even when vacuum chucking is being done for the substrate.

SUMMARY OF THE INVENTION

A susceptor for semiconductor manufacturing apparatus according to the present invention includes: a support member on which a substrate is placed; a recessed wafer pocket formed on an upper surface of the support member; a seal band that supports the substrate at a periphery of the wafer pocket; a through hole which is formed in the wafer pocket and through which evacuation is made from the upper surface of the support member toward a lower surface of the same in order to secure the substrate onto an upper surface of the seal band by vacuum chucking; and a gas channel formed on the upper surface of the seal band to allow gas to pass through the gas channel from an outer circumference of the seal band toward the wafer pocket.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

DETAILED DESCRIPTION OF THE PREFERRED EMBODIMENTS

A structure of a susceptor for semiconductor manufacturing apparatus according to an embodiment of the present invention will be described below with reference to the drawings.

Figure 1A:
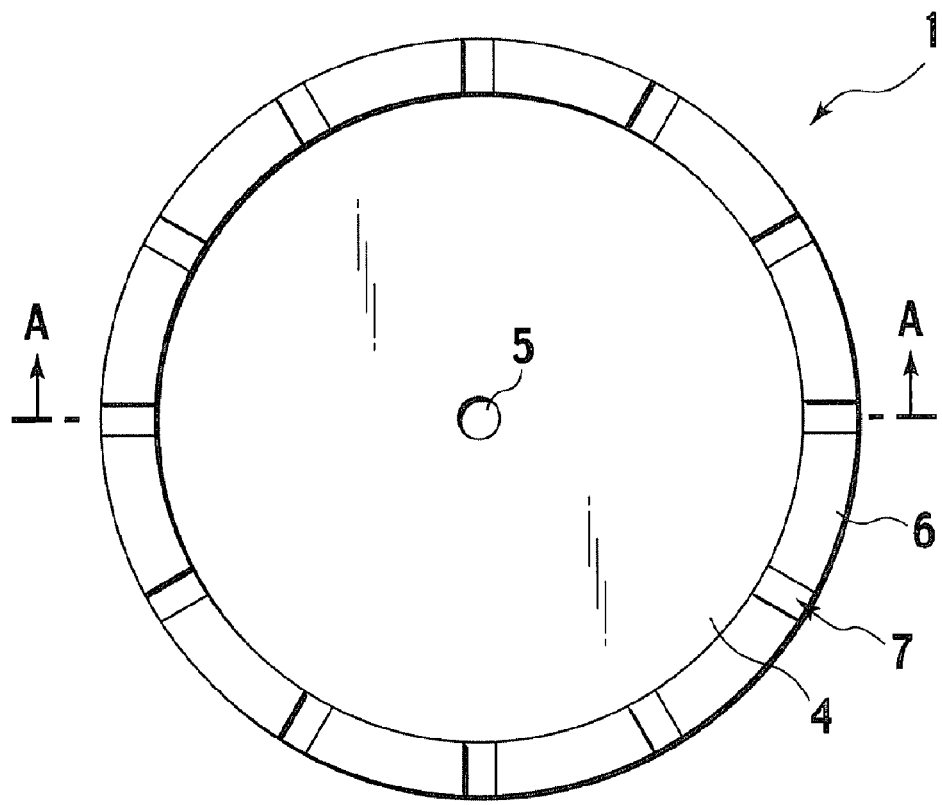
FIG. 1A is a top view showing a structure of a susceptor for semiconductor manufacturing apparatus according to an embodiment of the present invention.
Figure 1B:
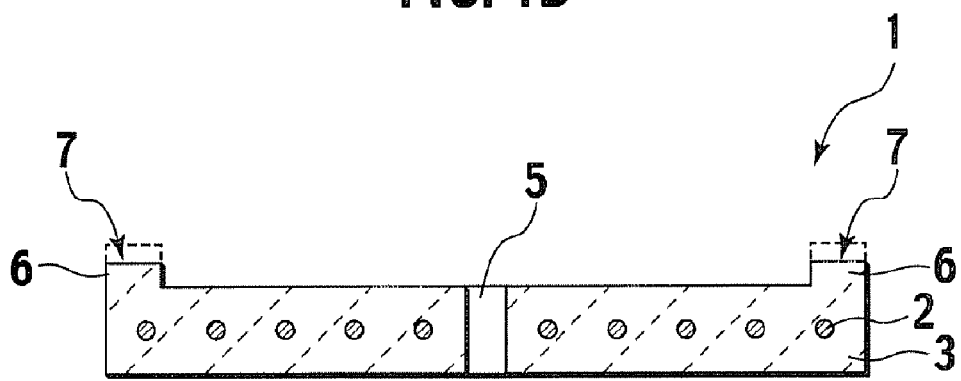
FIG. 1B is a cross section showing the structure of the susceptor for semiconductor manufacturing apparatus according to the embodiment of the present invention.

A susceptor 1 for semiconductor manufacturing apparatus according to the embodiment of the present invention includes, as shown in FIGS. 1A and 1B, an aluminum-nitride support member 3 in which heater electrodes 2 are buried to heat a substrate, a recessed wafer pocket 4 formed on an upper surface of the support member 3, a through hole 5 formed in the wafer pocket 4, and a seal band 6 that supports the substrate at a periphery of the wafer pocket 4. On an upper surface of the seal band 6, a plurality of gas channels 7 are formed to allows gas in a chamber (e.g., He gas or mixed gas of He and $N_2$) to pass therethrough from an outer circumference of the seal band 6 toward the wafer pocket 4.

In this susceptor 1 for semiconductor manufacturing apparatus, the gas flowing into the chamber from the outer circumference of the seal band 6 is heated in the gas channels 7 by heat supplied from the seal band 6 and then enters the wafer pocket 4. Therefore, the quantity of heat transmitted to a substrate region above the wafer pocket 4 is large compared to the case where no gas channels 7 are formed, and accordingly the temperature of the substrate region above the wafer pocket 4 becomes high. In contrast, the temperature of a substrate region above the seal band 6 becomes low compared to the case where no gas channels 7 are formed, because a contact area between the seal band 6 and the substrate decreases. According to this susceptor 1 for semiconductor manufacturing apparatus, temperature difference between the substrate region above the wafer pocket 4 and the substrate region above the seal band 6 becomes small, which improves the thermal uniformity of the substrate.

In an example shown in FIGS. 1A and 1B, the gas channels 7 are slit-shaped, which can be formed by sandblasting the aluminum-nitride support member 3 locally while it is revolved. Specifically, in order to form the gas channels 7 of 10 μm in depth, sandblasting is carried out using a nozzle with 10 mm diameter, positioned at 100 mm away from the support member 3, at 0.15-MPa injection pressure with 5-sec injection duration.

Figure 2:
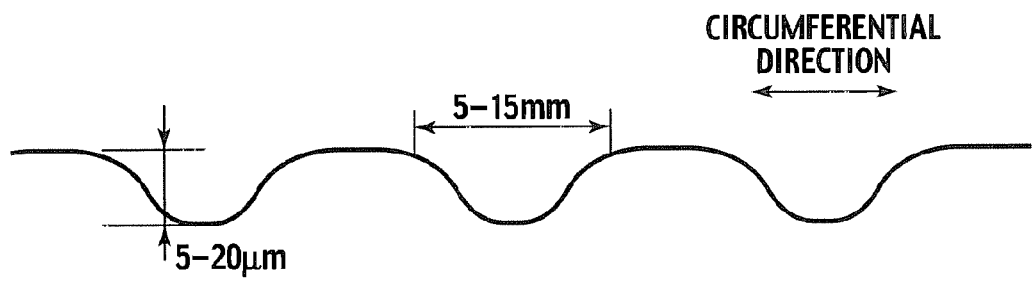
FIG. 2 is a schematic diagram showing a structure of a gas channel according to the embodiment of the present invention.

When the gas channels 7 are formed in slit-shape, corners of a slit are brought into contact with the substrate, which possibly produces particles of aluminum nitride. It would, therefore, be desirable that the gas channels 7 have a smooth, wavelike form as shown in FIG. 2. In an example of FIG. 2, the upper surface of the seal band 6 has a continuous, smooth waveform in a circumference direction, and a recessed part of the waveform serves as each of the gas channels 7. The height difference between the top and the bottom of this waveform is adjusted within a range of 5 to 20 μm, and the width of the waveform is also adjusted within a range of 5 to 15 mm.

Example

The present invention will be described further in detail by way of an example.

In the example, there were prepared a plurality of susceptors for semiconductor manufacturing apparatus each having different channel depths shown in the following Table 1. These susceptors were set individually in a chamber, and a substrate is placed on an upper surface of each susceptor for semiconductor manufacturing apparatus. The heater electrodes were charged to obtain a heating temperature of 500° C., for measurement of variations in thermal uniformity of substrates (difference between the maximum temperature Max and the minimum temperature Min in an in-plane direction L of substrate S) attributed to different depths of the gas channels. In the measurements, the pressure inside the chamber was 600 Torr, and the pressure between the rear surface of the substrate and the wafer pocket was 5 Torr. The measurement results are shown together in the following Table 1.

TABLE 1

| DEPTH OF RECESSED PART (μm) | THERMAL UNIFORMITY Max-Min (° C.) |
|---|---|
| 0 (NO RECESS) | 15 |
| 3 | 12 |
| 5 | 5 |
| 10 | 3 |
| 15 | 4 |
| 20 | 5 |
| 25 | 16 |
| 30 | 25 |

As apparent from Table 1, when the gas channel depth was 0 μm, that is, when the gas channels were not formed, the same structure as that of the conventional susceptor for semiconductor manufacturing apparatus was obtained, resulting in poor thermal uniformity of 15° C. (see FIG. 3). Even when the gas channels are not formed, an aluminum-nitride susceptor for semiconductor manufacturing apparatus actually includes a surface roughness of about 1 μm and a waviness of about 2 μm. Furthermore, the gas channel depth of 3 μm also resulted in poor thermal uniformity of 12° C. This is probably because excessively shallow gas channels do not sufficiently allow gas in the chamber to flow therethrough and the effect of heat transfer to the wafer pocket is reduced.

Figure 3:
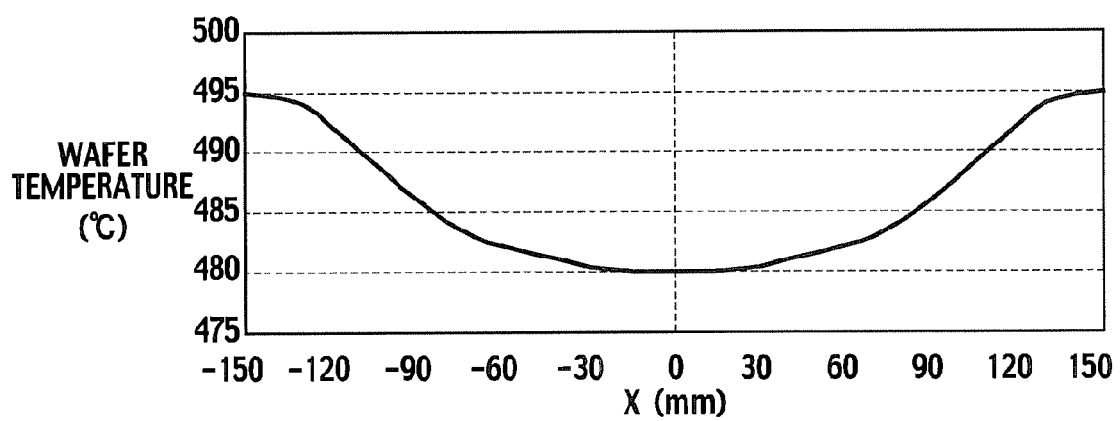
FIG. 3 is a diagram showing an evaluation result of thermal uniformity of a conventional susceptor for semiconductor manufacturing apparatus.
Figure 4:
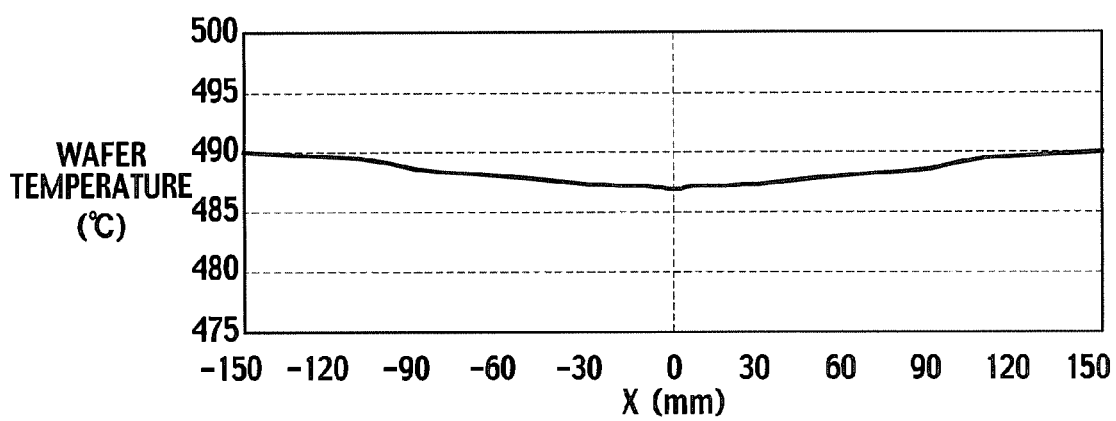
FIG. 4 is a diagram showing an evaluation result of thermal uniformity of the susceptor for semiconductor manufacturing apparatus according to the embodiment of the present invention.
Figure 5:
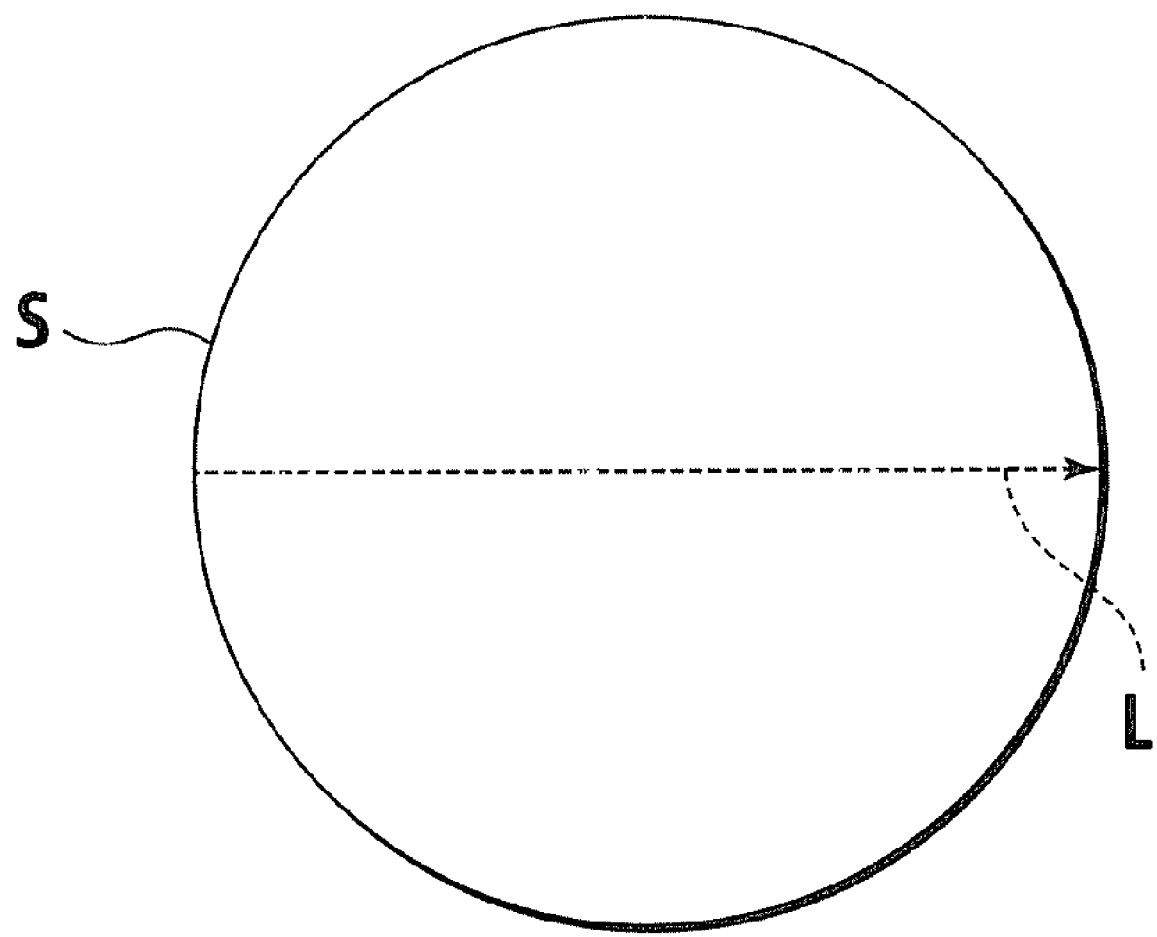
FIG. 5 is a diagram for explaining a method of measuring the evaluation results of thermal uniformity shown in FIGS. 3 and 4.

In contrast, the gas channel depth within the range of 5 to 20 μm resulted in excellent thermal uniformity of 5° C. or below (see FIG. 4). The gas channel depth of 25 μm or more, however, resulted again in poor thermal uniformity of 16° C. or above. This is probably because excessively deep gas channels eliminate the function itself of a vacuum chuck that chucks a substrate on the upper surface of the seal band. From these results, the gas channel depth within the range of 5 to 20 μm was found to yield excellent thermal uniformity. It is to be noted here that the evaluation results of the thermal uniformity in FIGS. 3 and 4 are shown by profiling temperature data on a temperature measurement axis of a substrate illustrated in FIG. 5.

Although the present invention made by the present inventors has been described in reference to its embodiment, the statement and drawings constituting part of the disclosure of the present invention should not be regarded as limiting the present invention. Various alternative embodiments, examples, and operation techniques made by those skilled in the art on the basis of the foregoing embodiment are, of course, within the scope of the present invention.

What is claimed is:

1. A susceptor for a semiconductor manufacturing apparatus that secures a substrate thereon by vacuum chucking, comprising:
   a support member on which the substrate is placed;
   a recessed pocket formed within an upper surface of the support member;
   a seal band defining an outer peripheral region of the susceptor and supporting the substrate at the outer peripheral region of the susceptor;
   a through hole which is formed in the recessed pocket and through which evacuation is made from the upper surface of the support member toward a lower surface thereof in order to secure the substrate onto an upper surface of the seal band by said vacuum chucking; and
   at least one gas channel formed on the upper surface of the seal band to allow gas to pass through the gas channel from an outer circumference of the seal band toward the recessed pocket;
   wherein said susceptor is positioned for holding the substrate during semiconductor processing of the substrate
   wherein the upper surface of the seal band has a continuous waveform in a circumference direction, and a recessed part of the waveform serves as the gas channel.

2. The susceptor for semiconductor manufacturing apparatus according to claim 1, wherein a depth of the gas channel is within a range of 5 to 20 μm.

3. The susceptor for semiconductor manufacturing apparatus according to claim 1, wherein the support member is made of aluminum nitride.

4. A susceptor for a semiconductor manufacturing apparatus that secures a substrate thereon by vacuum chucking, comprising:
   a support member on which the substrate is placed;
   heater electrodes to heat said substrate that are embedded within the support member;
   a recessed pocket formed within an upper surface of the support member;
   a seal band defining an outer peripheral region of the susceptor and supporting the substrate at the outer peripheral region of the susceptor;
   a single through hole which is formed in the center of the recessed pocket and through which evacuation is made from the upper surface of the support member toward a lower surface thereof in order to secure the substrate onto an upper surface of the seal band by said vacuum chucking; and at least one gas channel formed on the upper surface of the seal band to allow gas to pass through the gas channel from an outer circumference of the seal band toward the recessed pocket;

wherein said susceptor is positioned for holding the substrate during semiconductor processing of the substrate wherein the upper surface of the seal band has a continuous waveform in a circumference direction, and a recessed part of the waveform serves as the gas channel.

* * * * *